(12) United States Patent
Matsuo

(10) Patent No.: US 7,825,566 B2
(45) Date of Patent: Nov. 2, 2010

(54) ULTRASONIC ACTUATOR AND METHOD FOR MANUFACTURING PIEZOELECTRIC DEFORMATION PORTION USED IN THE SAME

(75) Inventor: Takashi Matsuo, Suita (JP)

(73) Assignee: Konica Minolta Opto, Inc., Hachioji-shi (JP)

( * ) Notice: Subject to any disclaimer, the term of this patent is extended or adjusted under 35 U.S.C. 154(b) by 168 days.

(21) Appl. No.: 12/181,599

(22) Filed: Jul. 29, 2008

(65) Prior Publication Data

US 2009/0039736 A1    Feb. 12, 2009

(30) Foreign Application Priority Data

Aug. 8, 2007    (JP) .............................. 2007-206511

(51) Int. Cl.
  *H01L 41/04* (2006.01)
  *H02N 2/04* (2006.01)
(52) U.S. Cl. .............................. 310/323.01; 310/323.04; 310/367
(58) Field of Classification Search ................................. 310/323.01–323.21, 328, 365–367
See application file for complete search history.

(56) References Cited

U.S. PATENT DOCUMENTS 4,814,660 A * 3/1989 Yamada et al. ............... 310/328

7,215,062 B1 * 5/2007 Iino et al. .............. 310/323.02

FOREIGN PATENT DOCUMENTS

| JP | 8-322270 A | 12/1996 |
|---|---|---|
| JP | 2000-152671 A | 5/2000 |

* cited by examiner

*Primary Examiner*—Walter Benson
*Assistant Examiner*—Derek J Rosenau
(74) *Attorney, Agent, or Firm*—Sidley Austin LLP

(57) ABSTRACT

Provided are an ultrasonic actuator and a method for manufacturing an piezoelectric deformation portion in which wiring a drive circuit can be easily processed, and in which productivity can be increased. The ultrasonic actuator comprises: a triangular vibrating member which has a piezoelectric deformation portion which is deformed by driving signals; a moving member that is pressure-contacted to at least one of the vertices of the vibrating member and generates a movement relative to the vibrating member; and a plurality of external electrodes integrally provided on one side surface of the vibrating member; wherein the piezoelectric deformation portion is formed by alternately laminating piezoelectric layers made of piezoelectric material and internal electrode layers including internal electrodes, and the plurality of external electrodes interconnect the internal electrodes in a prescribed combination.

4 Claims, 10 Drawing Sheets

ULTRASONIC ACTUATOR AND METHOD FOR MANUFACTURING PIEZOELECTRIC DEFORMATION PORTION USED IN THE SAME

This application is based on Japanese Patent Application No. 2007-206511 filed on Aug. 8, 2007, in Japanese Patent Office, the entire content of which is hereby incorporated by reference.

TECHNICAL FIELD

The present invention relates to an ultrasonic actuator and a method for manufacturing a piezoelectric deformation portion used in the same. More particularly, the present invention relates to an ultrasonic actuator in which a moving member is pressure-contacted with a vibrating member to generate movement relative to the vibrating member and to a method for manufacturing a piezoelectric deformation portion used in the same.

Conventionally, use of ultrasonic actuators has been attempted in various mobile apparatuses. Ultrasonic actuators are usually configured using a vibrating member provided with a piezoelectric device which is an electromechanical energy conversion device, and a driven member (moving member) that contacts the vibrating member in a state in which it is pressed against the vibrating member. An ultrasonic actuator causes relative movement due to frictional force between the driven member which is pressure contacted with the vibrating member when an elliptical vibration (hereinafter includes a circular vibration) of a part of the vibrating member is caused by an expansion and contraction movement of the vibrating member upon input of a driving signal to the vibrating member.

Since an ultrasonic actuator has a small size and has excellent low noise characteristics, and since it is possible to carry out high speed and high accuracy position control, it has come to be used as the driving device in electronic equipment such as electronic cameras, etc., and its applications are still expanding.

On the other hand, in recent years, along with the progress in size reduction and higher performance of electronic equipment, there has been a demand for still higher performance in the drive capability of ultrasonic actuators used as the driving device of electronic equipment.

Thus, in order to meet such requirements, various investigations have been made to increase the driving efficiency of ultrasonic actuators.

For example, there is known (see Japanese Unexamined Patent Application Publication No. H08-322270) a rotational drive type ultrasonic actuator which is provided with an equilateral triangle shaped piezoelectric vibrating element with an electrode divided into two pieces by the line connecting one of the vertices, which serve as a point of contact with the moving member, and the middle point of its opposite side, where elliptical vibration is excited, by exciting and synthesizing an expansion and contraction vibration and a bending secondary mode vibration, at the vertex that serves as the point of contact with the moving member, thereby frictional drive of the moving member is caused. Further, an ultrasonic motor is known (see Japanese Unexamined Patent Application Publication No. 2000-152671) in which a rotor is supported and driven rotationally using a plurality of ultrasonic vibrating elements.

However, in the ultrasonic actuator that has this type of configuration, the electrode layer of the piezoelectric element is usually configured of a plurality of electrodes divided into multiple regions in order to excite an expansion and contraction vibration mode and bending vibration mode and the like in the piezoelectric element. In addition, by supplying prescribed driving signals from a drive circuit to the electrodes through lead wires or a flexible printed circuit (FPC), the expansion and contraction vibration mode and bending vibration mode and the like are excited in the piezoelectric element.

As advances are made in the performance and miniaturization of electronic devices, it is expected that connection of the lead wires or the FPC and the like to a plurality of the electrodes, as well as the routing of these wire members can be easily processed in the small space inside the devices.

However, in the ultrasonic actuator disclosed in Unexamined Japanese Patent Application Publication No. H08-322270, the configuration is such that the electrodes and the wire members are respectively connected at the vicinity of the center of each side of the triangular piezoelectric element. That is to say, the connections of the wire members and the electrodes are made at three separate positions, and thereby making connections with wire members and routing of wires difficult.

Furthermore, Unexamined Japanese Patent Application Publication No. 2000-152671 does not disclose any electrode configuration or electrode arrangement for easy process of wire members.

SUMMARY

The present invention was conceived in view of the problems described above, and an object thereof is to provide an ultrasonic actuator in which wires connected to a drive circuit can be easily processed and in which productivity is increased. Another object is also to provide a method for manufacturing a piezoelectric deformation portion used in the ultrasonic actuator.

In view of forgoing, one embodiment according to one aspect of the present invention is an ultrasonic actuator, comprising:

a vibrating member which includes a piezoelectric deformation portion and deforms by a driving signal; the piezoelectric deformation portion including:
  a plurality of piezoelectric layers made of a piezoelectric material;
  a plurality of internal electrode layers alternately laminated with the piezoelectric layers, each of the internal electrode layers being divided into a plurality of internal electrodes, each of which is applied with the driving signal;
  wherein a cross section of the vibrating member perpendicular to a direction of the lamination is a substantially triangular shape having three vertices;
  a plurality of external electrodes which are integrally provided on a side surface including one side of the triangular shape, each of the external electrodes electrically interconnecting internal electrodes, which are overlapping one another in the direction of the lamination, in a predetermined combination,
a moving member which is pressure-contacted with the vibrating member at least one of the vertices and moves relatively to the vibrating member by a deformation motion of the vibrating member.

According to another aspect of the present invention, another embodiment is a method for manufacturing a piezoelectric deformation portion used in an ultrasonic actuator, the method comprising the steps of:

forming external electrodes on a side surface of a piezoelectric block, which is formed by alternately laminating a plurality of piezoelectric layers and a plurality of internal electrode layers each of which has a plurality of internal electrodes arranged in a plane, with a plurality of the external electrodes disposed on each of a plurality of piezoelectric deformation portions which constitute the piezoelectric block;

wherein each of the external electrodes interconnects internal electrodes, which are overlapping one another in the direction of the lamination, in a predetermined combination, cutting the piezoelectric block into the plurality of piezoelectric deformation portions such that a cross section of the piezoelectric deformation portion perpendicular to a direction of the lamination has a substantially triangular shape and the plurality of electrodes disposed on each of the piezoelectric deformation portions are arranged on a side surface of the piezoelectric deformation portion including a side of the triangular shape.

DETAILED DESCRIPTION OF THE PREFERRED EMBODIMENTS

Figure 1A:
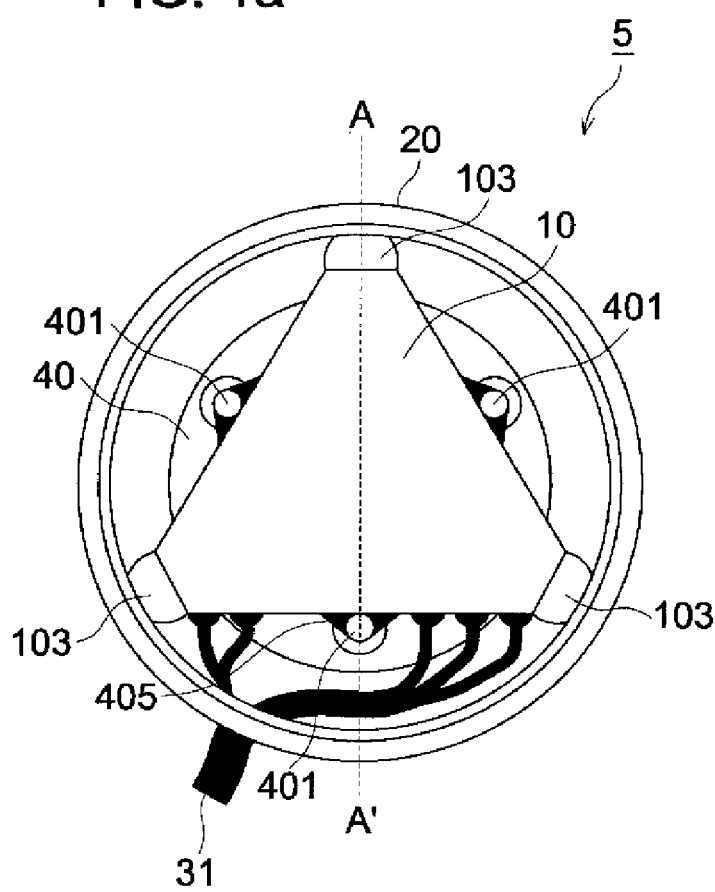
FIGS. 1a and 1b show the overall configuration of an ultrasonic actuator according to an embodiment 1 of the present invention.

The following is a description of the embodiments of an ultrasonic actuator and a method for manufacturing a piezoelectric deformation portion used in the same. It is to be noted that the present invention is described using the embodiments shown in the drawings, but the present invention is not to be limited to the embodiments. In addition, the same or equivalent parts in the embodiments are assigned the same numbers, and repeated descriptions thereof are omitted.

Preferred Embodiment 1

Figure 1B:
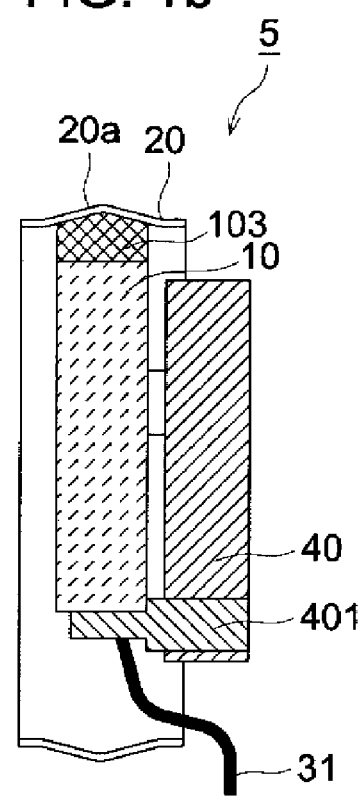

Firstly, the structure of an ultrasonic actuator 5 according to the first preferred embodiment is explained referring to FIGS. 1a and 1b. FIG. 1a is a front view showing the outline of the overall configuration of the ultrasonic actuator 5, and FIG. 1b is a cross-sectional diagram along a line A-A' in FIG. 1a.

As is shown in FIG. 1a, the ultrasonic actuator 5 has a vibrating member 10, a rotor 20, and a fixing member 40, etc.

The vibrating member 10 has the shape of an equilateral triangle, and the hollow cylindrical shaped rotor 20 is contacting each of the vertices of the equilateral triangle from the outside. Before the rotor (moving member) 20 is assembled on the vibrating member 10, the dimension of the shape connecting the contact points has been set to be smaller than the dimensions of the vibrating member 10, and upon being assembled, the parts other than the contacting part get elastically deformed (in the assembled state, the rotor 20 is slightly triangular in shape), and a prescribed pressure force due to the rotor 20 acts on each contact point of the vibrating member 10.

As is shown in FIG. 1b, a V-shaped groove 20a is formed in the circumferential inner surface of the rotor 20. Since three projection shaped chip members (as contact members of the present invention) 103 provided as described later on each of the vertices of the vibrating member 10 get engaged with the V-shaped groove 20a of the rotor 20, the swinging in the thrust direction is decreased, and the rotor 20 can carry out rotation with a high accuracy.

The vibrating member 10 is supported by three fixing pins 401 provided on the fixing member 40 and adhesive material 405 as described later in the neighborhood of the middle points of the sides where the vibration is relatively small. The supporting is done by pressure insertion or adhesion. Further, it is also possible to position the vibrating member with respect to the fixing member 40 by supporting, by the fixing pins 401, the notches provided in the neighborhood of the middle point of the sides of the vibrating member 10. In the application of the actuator according to the present preferred embodiment, the ultrasonic actuator 5 is positioned, for example, by fixing the fixing member 40 to the chassis or the frame of the devices in which the ultrasonic actuator 5 is installed.

Figure 2A:
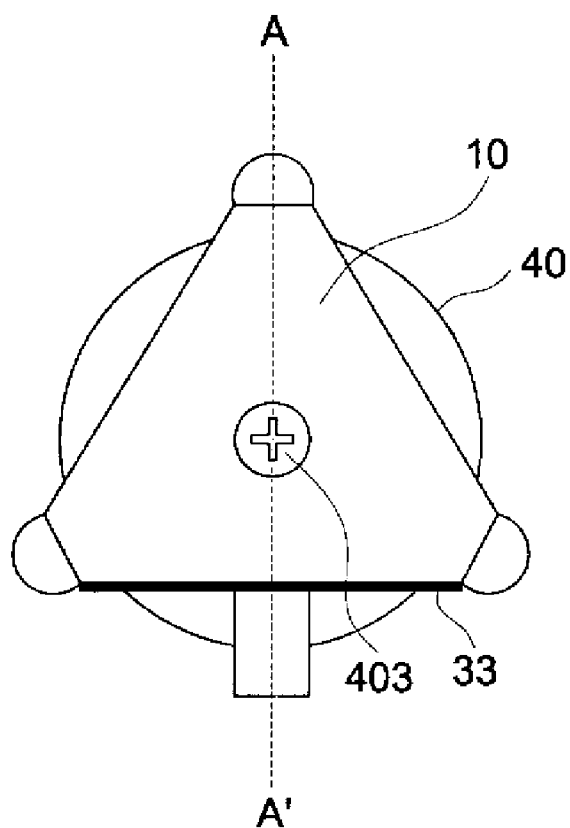
FIGS. 2a and 2b show a method for fixing a vibrating member according to the embodiment 1.
Figure 2B:
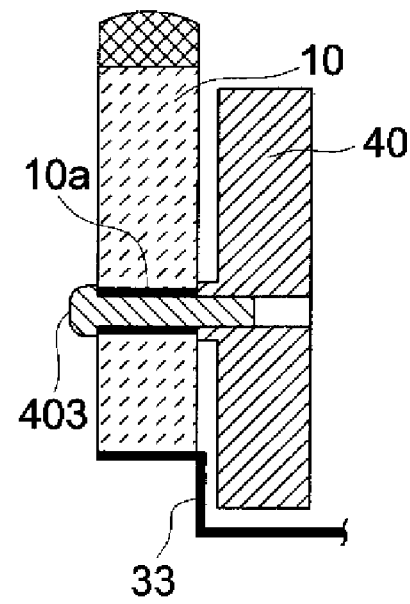

A method of fixing the vibrating member 10 in another method is shown in FIGS. 2a and 2b. FIG. 2a is the front view showing an outline of the vibrating member 10, and FIG. 2b is the cross-sectional diagram along the line A-A' in FIG. 2a.

As shown in FIG. 2b, it is also possible to provide a through hole 10a at the position of the center of gravity of the vibrating member 10, and to fix it using a screw 403, etc. Since the position of the center of gravity is a node of vibration, the effect on the vibration caused by the fixing can be decreased to a minimum.

A material with a large elasticity is desirable for a material of the rotor 20, and metallic materials such as stainless steel are used. Further, in order to reduce wear, hardening treatment such as nitriding treatment is preferably made on the surface. In addition, it is also possible to carry out ceramic coating such as CrN or TiCN.

Lead wires 31 as shown in FIGS. 1a, 1b, 2a and 2b or an FPC (flexible printed circuit board) 33 is connected to the vibrating member 10, and driving voltage as a prescribed driving signal (to be described later) is inputted through the lead wires or the FPC 33 from a driving signal generator (not shown).

When the driving signal is inputted to the vibrating member 10, elliptical vibrations that rotate in the same direction are generated in the three chip members 103, which are provided on the three vertices of the vibrating member 10, to be described later. Since the rotor 20 is contacted with the chip members 103 with a prescribed pressure, the rotor 20 rotates due to frictional force. In FIG. 1a, in the case in which each of the vertices cause elliptical vibration in a clockwise direction, the rotor 20 also rotates in the clockwise direction, and in the case in which each of the vertices causes elliptical vibration in an anticlockwise direction, the rotor 20 also rotates in the anticlockwise direction. Further, by varying the magnitude of the elliptical vibrations, it is possible to change the speed or the torque.

Since the rotor 20 is held by the three chip members 103 provided at the vertices of the vibrating member 10 with the shape of an equilateral triangle, the stability of orientation in the radial direction is extremely high, and also, since the swinging in the thrust direction is being controlled by the V-shaped groove 20a, it is possible to carry out rotation with an extremely high accuracy with very little fluctuation of the center. Further, since there is very little backlash, the rigidity is high, and it is possible to enhance the response of the motor. In addition, since there is no need for other members to hold the rotor 20 than the three vertices of the vibrating member 10, drive loss is suppressed, and it is possible to obtain a high driving efficiency.

Figure 3A:
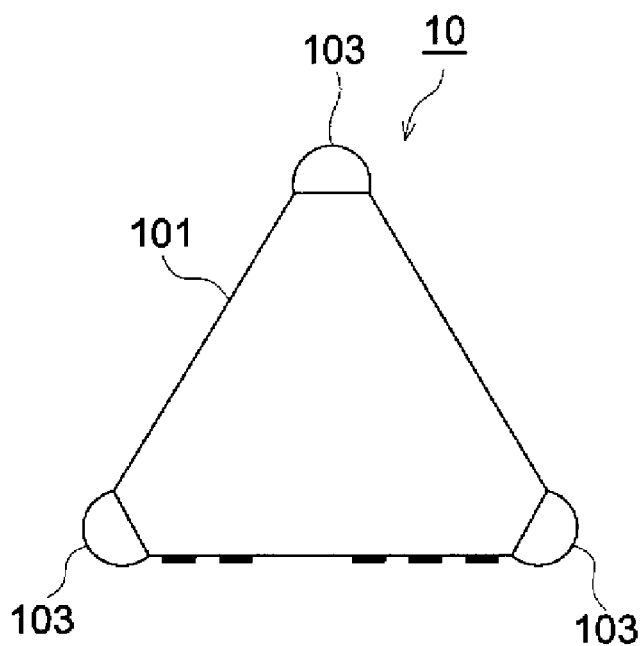
FIGS. 3a, 3b and 3c show the configuration of the vibrating member according to the embodiment 1.
Figure 3B:
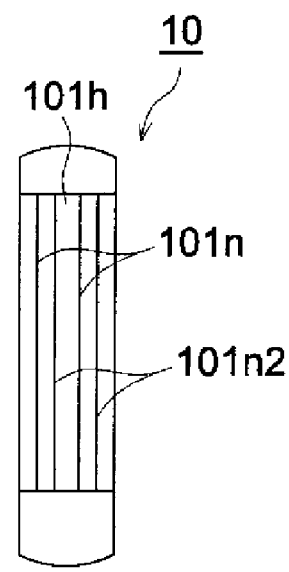
Figure 3C:
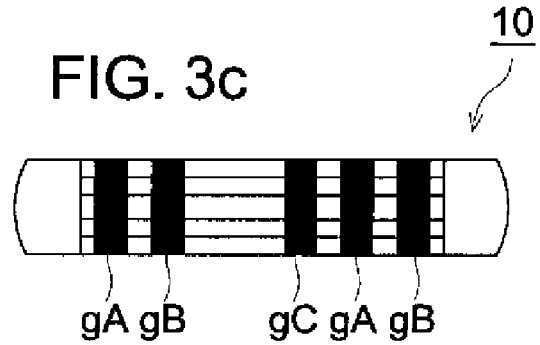

Next, the structure of the vibrating member 10 is explained referring to FIGS. 3a, 3b, and 3c. FIG. 3a is a diagram of front view showing the structure of the vibrating member 10, FIG. 3b is a right side view diagram, and FIG. 3c is the bottom view diagram.

As shown in FIG. 3a, the vibrating member 10 is made of three chip members 103 that are in contact with the rotor 20, and a piezoelectric member 101 with flat parts formed at the vertices of an equilateral triangle. The chip members 103 are bonded to the piezoelectric member (piezoelectric deformation portion) 101 by adhesion. An epoxy type adhesive material with a high rigidity and with a high adhesive strength is used for this adhesion.

As the material of the chip members 103, a ceramic such as alumina or zirconia having a high hardness, or an ultra-hard alloy, etc., is used in order to reduce wear.

The piezoelectric member (piezoelectric deformation portion) 101 comprises a thin piezoelectric ceramic plate 101h that is formed of a piezoelectric material, such as PZT (lead zirconate titanate), which exhibits piezoelectric properties and the like, and first internal electrode layer 101n1 and second internal electrode layer 101n2 described hereinafter are formed of silver or palladium and are laminated alternately. The piezoelectric member (piezoelectric deformation portion) 101 also comprises external electrodes described hereinafter.

Figure 4A:
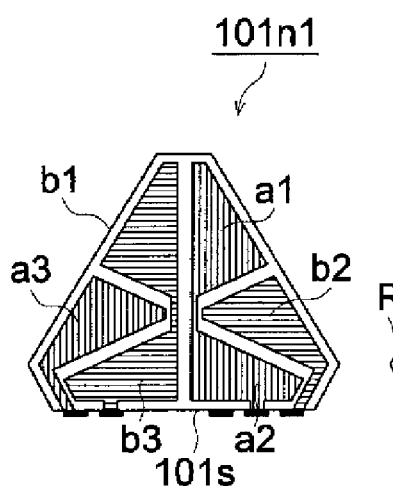
FIGS. 4a, 4b, 4c and 4d show the configuration of the internal electrodes of a first example of the embodiment 1.
Figure 4B:
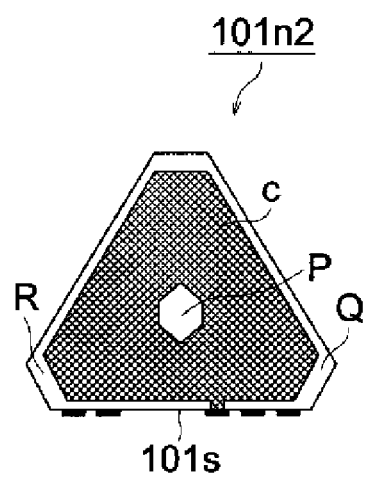
Figure 4C:
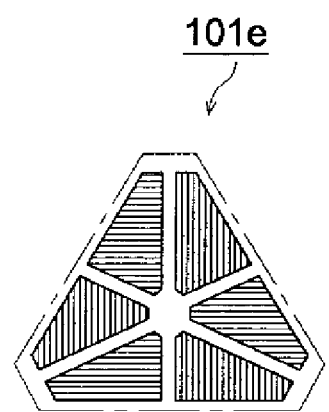
Figure 4D:
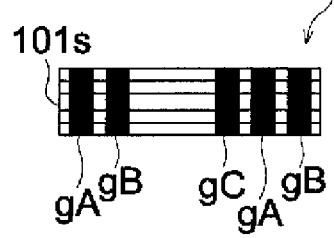

FIGS. 4a, 4b, and 4c show the configuration of an internal electrode according to a first example. FIG. 4a shows a first internal electrode layer 101n1; FIG. 4b shows a second internal electrode layer 101n2; FIG. 4c shows the configuration of the effective piezoelectric region; and FIG. 4d is a side view of the piezoelectric member 101 showing the arrangement of external electrodes gA, gB and gC.

I order to exciting an elliptical vibration in each of the vertices of the vibration member 10, as shown in FIG. 4a, the first internal electrode 101n1 is configured so as to be divided (into 6 pieces) by normal lines drawn from each vertex of the vibrating member 10 to the opposing side, where a pair of A-phase electrodes a1 (or a2, or a3) and B-phase electrode b1 (or b2, or b3) are formed in correspondence to each of the vertices.

Each of the A-phase electrodes a1, a2, a3 and the B-phase electrodes b1, b2 and b3 are interconnected following the configuration described hereinafter to have the same electric potential. In addition, in order to interconnect each of the A-phase electrodes and the B-phase electrodes, lead patterns are formed in a path pattern as shown FIG. 4a, and a portion thereof is projected from the side surface 101s of the piezoelectric member 101.

The second internal electrode layer 101n2 is a common GND electrode. In order to interconnect the GND electrodes c, a part of them is projected from the side surface 101s of the vibration member 10, as is the case with the A-phase electrodes and the B-phase electrodes as shown in FIG. 4b.

In addition, if the GND electrode c is present at the sites P, Q and R which face the lead pattern to the side surface 101s of the piezoelectric member 101, an electric field is generated at those sites and deformation occurs to adversely effect the vibration. Therefore, the GND electrodes are patterned not to have an electrode at the sites P, Q and R. Thus, the effective piezoelectric region due to the first internal electrode layers 101n1 and the second internal electrode layers 101n2 has a pattern 101e as shown in FIG. 4c.

As shown in FIG. 4d, the external electrodes gA, gB and gC are formed by printing and the like at the side surface (end surface) 101s of the piezoelectric member 101 in correspondence to each of the projected portion of the A-phase electrode, the B-phase electrodes and the GND electrodes. These external electrodes are connected to the internal electrode layers (A-phase electrodes, B-phase electrodes and GND electrodes). The A-phase electrode and the B-phase electrode form each 2 patterns (2 lines) from the lead pattern to the side surface 101s, and they are interconnected through the lead patterns connected to the external electrode or FPC. Alternatively, circuit patterns may also be provided on the side surface 101s to be shared.

Figure 5A:
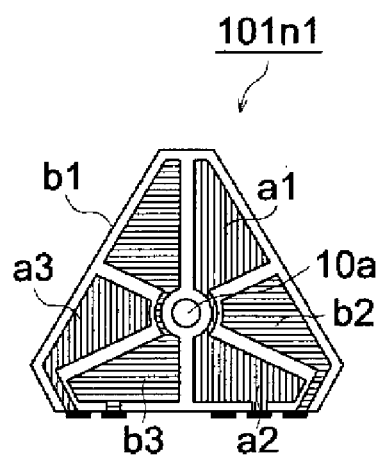
FIGS. 5a, 5b, 5c and 5d show the configuration of the internal electrodes of a second example of the embodiment 1.
Figure 5B:
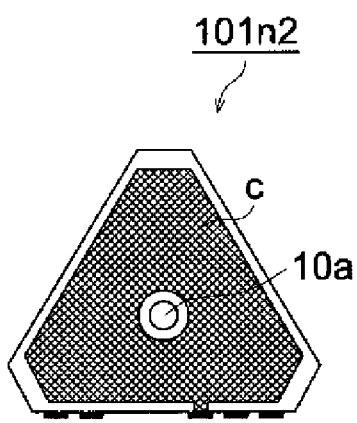
Figure 5C:
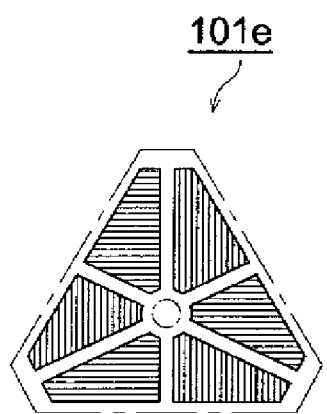
Figure 5D:
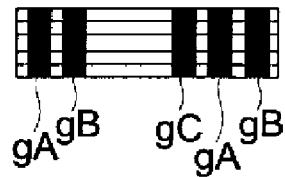
Figure 6A:
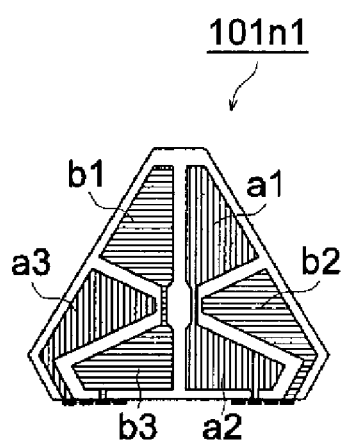
FIGS. 6a, 6b, 6c and 6d show the configuration of the internal electrodes of a third example of the embodiment 1.
Figure 6B:
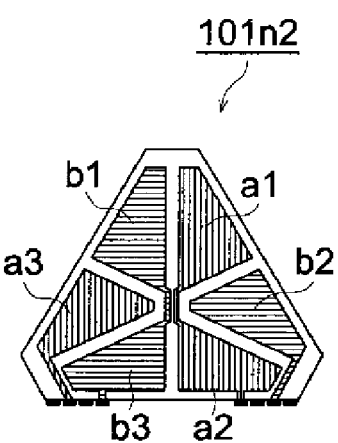
Figure 6C:
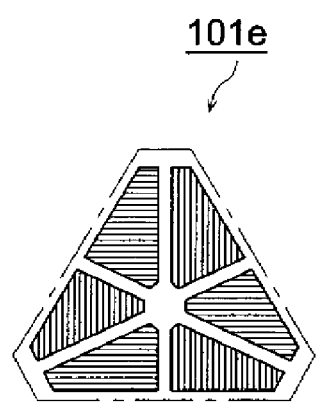
Figure 6D:
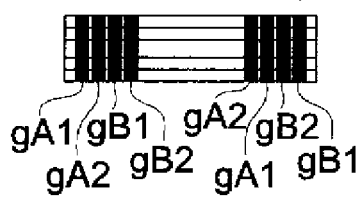

FIGS. 5a, 5b, 5c and 5d show the configuration of the internal electrode layer and the external electrode of a second example of the embodiment 1. The internal electrode pattern shown in FIGS. 5a, 5b and 5c is the pattern which corresponds to the case where a through hole 10a is provided at the center position of the vibrating member as shown in aforementioned FIGS. 2a and 2b. The pattern is the same as that of aforementioned FIGS. 4a, 4b and 4c except the pattern configuration in the vicinity of the through hole 10a.

FIGS. 6a, 6b, 6c and 6d show the configuration of the internal electrode layer and the external electrode of a third example of the embodiment 1. The second internal electrode layer 101n2 is not used as the common GND electrode and is divided into 6 pieces as is the case with the first internal electrode layer 101n1, and a pair of A-phase electrodes a1 (or a2, or a3) and B-phase electrodes b1 (or b2, or b3) are formed in correspondence to each vertex. Because there is no GND electrode, by applying +5V to the A-phase electrodes of the first internal electrode layer 101n1, and −5V to the A-phase electrodes of the second internal electrode layer 101n2, a 10V voltage, which is twice the amount, can be applied between the A-phase electrodes and between the B-phase electrodes, and thus the supply voltage can be low. It is to be noted that in FIG. 6d, the external electrodes gA1 and gB1 are connected to the A-phase electrodes and the B-phase electrodes of the first internal electrode layers 101n1 respectively, and the external electrodes gA2 and gB2 are connected to the A-phase electrode and the B-phase electrodes of the second internal electrode layers 101n2 respectively.

As long as the circuit pattern of the internal electrodes have the basic configuration of being divided into 6 pieces, the configuration of the lead pattern to the side surface 101s of the piezoelectric member 101 is not limited to the aforementioned embodiment.

In this manner, in the ultrasonic actuator 5 of the embodiment of the present invention, all of the plurality of external electrodes gA, gB and gC are disposed on the same side surface 101s of the piezoelectric member 101, and thus connection of the external electrodes with the lead wires or the FPC and the like, or the routing of these wire members can be easily processed.

Next, a method for manufacturing a piezoelectric member 101 having this type of configuration will be described using FIGS. 7a, 7b, 7c and 7d. FIGS. 7a through 7d show the steps for manufacturing the piezoelectric member 101.

The method for manufacturing the piezoelectric member 101 comprises: a step of laminating and baking of the piezoelectric block (FIG. 7a); a first cutting step (FIG. 7b); an external electrode printing step (FIG. 7c); a second cutting step (FIG. 7d) and a polarization and inspection step (not shown).

(Step of Laminating and Baking)

An internal electrode layer 101n1 (101n2) having a prescribed electrode pattern is printed onto a green sheet formed by stretching a thin piezoelectric plate 101h into a sheet of a prescribed thickness, and after a prescribed number of sheets are laminated, they are baked to form a piezoelectric block 101A.

(First Cutting Step)

Figure 7A:
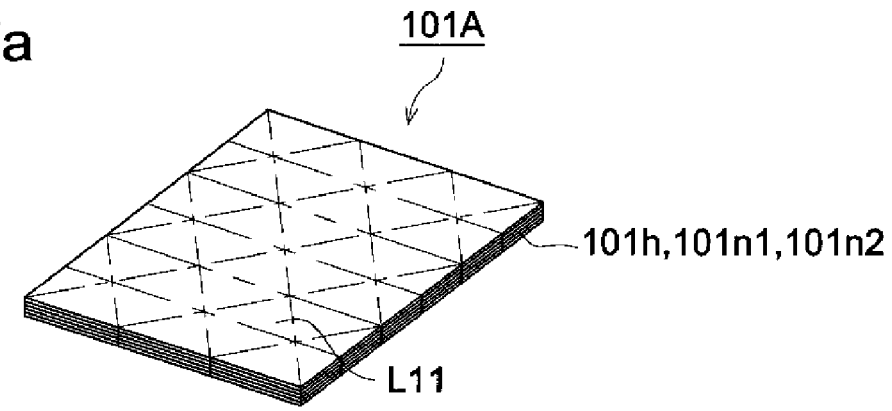
FIGS. 7a, 7b, 7c and 7d show the steps for manufacturing a piezoelectric member.
Figure 7B:
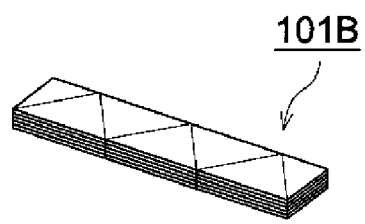

This piezoelectric block 101A is cut along lines L11 shown in FIG. 7a by a dicer, for example, to form a strip-like piezoelectric block 101B as shown in FIG. 7b.

(External Electrode Printing Step)

Next, external electrodes gA, gB and gC are formed with a prescribed pattern by screen printing and the like on both of the side surfaces of the strip-like piezoelectric block 101B.

(Second Cutting Step)

Figure 7C:
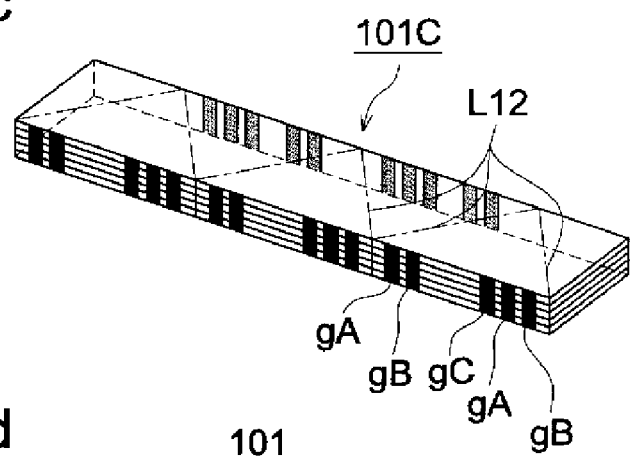
Figure 7D:
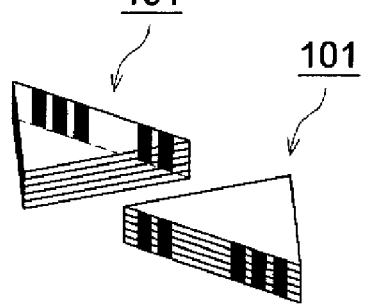

Next, the piezoelectric block 101C on which the external electrodes gA, gB and gC are formed is cut by a dicer or the like along the lines L12 shown in FIG. 7c to form piezoelectric members 101 having a prescribed triangular shape as shown in FIG. 7d.

In this manner, because the external electrodes are all placed on the same side surface of the triangular piezoelectric member 101 in the external electrode printing step, the external electrodes of the plurality of piezoelectric members 101 can be printed at one time, and this increases productivity and reduces manufacturing cost. In addition, polarization and inspection may be carried out for the strip-like piezoelectric element 101B, and this further improves productivity. Cutting the piezoelectric block 101A to be the final shape (triangular piezoelectric member 101) may be done in the first cutting step, and the external electrode printing step may be carried out in the state where a plurality of cut piezoelectric members 101 are aligned and held together by jigs and the like. In this case, the second cutting step can be eliminated.

Next, the method of driving the ultrasonic actuator 5 of this type of structure will be explained below. The basis of the driving method is elliptical vibration driving using resonance for rotating the rotor 20. Resonance is used in this method of driving by exciting elliptical vibration in each of the vertices of the vibrating member 10, and it is possible to enlarge the amplitude by several tens of times, and it is possible to obtain a large elliptical vibration efficiently using even a low voltage. The principle of its operation and the driving characteristics are explained in the following.

(Characteristic Mode)

Figure 8A:
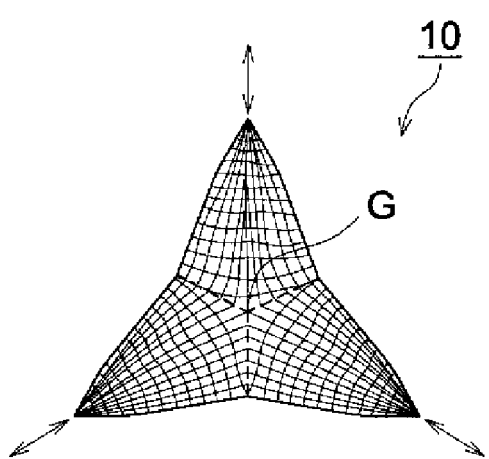
FIGS. 8a and 8b shows the state of deformation in the characteristic modes of a vibrating member.
Figure 8B:
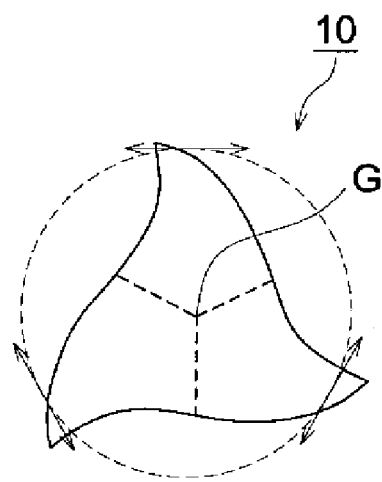

To begin with, the characteristic mode is explained here referring to FIGS. 8a and 8b. In the characteristic mode, in order to excite an elliptical vibration with the same rotation direction in each of the vertices of the vibrating member 10, in the present preferred embodiment, the two vibration modes shown in FIGS. 8a and 8b are used. FIG. 8a is a schematic diagram showing the deformations of the vibrating member 10 in the expansion and contraction vibration mode, and FIG. 8b is that in the bending vibration mode. In the expansion and contraction vibration mode, the position of the center G of gravity of the vibrating member 10 is a node of vibration, and the three regions divided to each include one the three vertices carry out expansion and contraction vibration, and each of the vertices causes reciprocating movement radially in phase. In the bending vibration mode, the position of the center G of gravity of the vibrating member 10 is the node of vibration, and the three regions divided to each include one of the three vertices carry out bending vibrations, and each of the vertices causes reciprocating movement in phase in the tangential direction of the circumference of the circumscribed circle, whose center is the point G of gravity, of the vibrating member 10. Each mode can be excited by inputting driving signals of the same frequency corresponding to each resonance frequency to the A-phase electrodes a1, a2, a3 and B-phase electrodes b1, b2, b3, in the same phase for the three-point expansion and contraction vibration mode or in the opposite phases for the three-point bending vibration mode.

(Phase Difference Driving Method)

By making the two resonant frequencies of the two characteristic modes described earlier to be almost equal to each other, and by providing driving signals VA and VB of a frequency equal to the resonant frequency and with phase difference, for example, of 90° to the A-phase electrodes a1, a2, a3 and the B-phase electrodes b1, b2, b3, the two characteristic modes are simultaneously excited and synthesized, and elliptical vibrations in phase and with the same direction of rotation are generated in the vertices of the vibrating member 10. When the relationship of the phase difference of the two driving signals VA and VB is reversed, the direction of rotation of the elliptical vibrations gets reversed. Further, by changing the amplitude and the phase difference between the driving signals VA and VB, it is possible to change the magnitude and the shape of the locus of the elliptical vibrations.

Figure 9A:
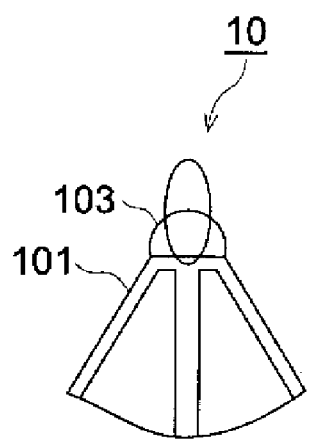
FIGS. 9a, 9b and 9c are pattern diagrams showing changes of the elliptical locus with respect to the phase difference of driving signals.
Figure 9B:
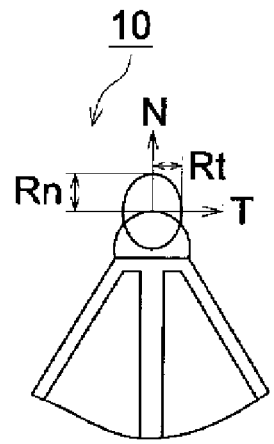
Figure 9C:
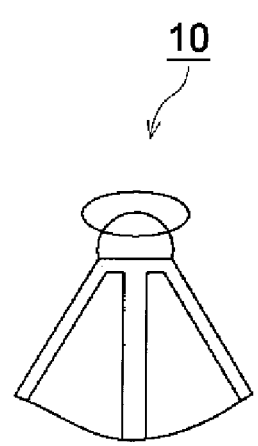

The diameter of the elliptical vibrations changes in proportion to the amplitude (voltage) of the driving signals. Further, by changing the phase difference between the driving signals VA and VB, it is possible to change the shape of the locus of the elliptical vibrations. FIGS. 9a, 9b, and 9c are schematic diagrams showing the changes in the elliptical locus with respect to the phase difference between the driving signals VA and VB. FIG. 9a shows the case in which the phase difference between the driving signals VA and VB is 45°, FIG. 9b is the case when the phase difference is 90°, and FIG. 9c is the case when the phase difference is 135°. As the phase difference becomes smaller, the diameter, of the ellipse, along the normal line N to the inner surface of the rotor 20 becomes larger, and as the phase difference becomes larger, the diameter of the ellipse along the tangential line T becomes larger. Since it is possible to change the drive characteristics by changing the shape of the elliptical locus as described later, it is possible to apply this to speed control or position control. Further, by carrying out phase difference drive by driving using driving signals VA and VB with A-phase difference, it is possible not only to drive with a low voltage but also to carry out drive control by the phase difference.

(Single Phase Driving Method)

The shape of the vibrating member is configured so that the resonance frequency of the expansion and contraction vibration mode and the resonance frequency of the bending vibration mode are set to be different from each other by a prescribed amount, and a single phase driving signal with a frequency between those two frequencies is applied to either of A-phase electrodes a1, a2, a3 or B-phase electrodes b1, b2, b3. By doing this, elliptical vibrations with the same phase and with the same direction of rotation are excited in each of the vertices of the vibrating member 10. By switching the set of electrodes to which the driving signal is inputted, it is possible to reverse the direction of rotation of the elliptical vibrations. By shifting the resonant frequencies of the two characteristic modes by a prescribed amount, the two characteristic modes are simultaneously excited in different phases and synthesized by the vibration force generated by the driving voltage applied to one of the electrode pair, thereby generating elliptical vibrations. Since it is possible to drive using a single phase driving signal, the drive circuit becomes simple, and it is possible to reduce the cost.

(Method for Adjusting Resonance Frequencies)

The resonance frequencies of two characteristic modes can be set so as to have a prescribed relationship depending on the mass of the chip members 103 or the diameter of the hole provided at the center of gravity of the vibrating member 10. Further, it is also possible to adjust the difference between the resonance frequencies, which have been determined at the time of manufacturing, of the two vibration modes by post processing.

(Elliptical Locus and Drive Characteristic)

Here, the relationship between the elliptical locus drawn by the chip members 103 due to the drive methods described above and the drive characteristics is explained referring to FIGS. 9a, 9b, and 9c described above. When the elliptical vibrations generated in the chip members 103 are separated into the component along the tangential direction T of the rotor 20 and the component along the normal direction N to the inner surface of the rotor 20, since the rotational speed of the rotor 20 is determined by the speed along the tangential direction T of the elliptical vibrations of the chip members 103, the speed is determined by the diameter Rt of the elliptical locus along the direction T and by the drive frequency, and the speed becomes larger as Rt becomes larger.

On the other hand, regarding the driving force, it basically depends on the product of the pressure force and the friction coefficient, however, the diameter Rn along the normal direction N of the elliptical locus also affects it. This is because, if the pressure force is small with respect to the diameter Rn along the pressure direction of the elliptical locus, the chip members 103 cause the elliptical motion while repeating contact and separation with the rotor 20, and drive the rotor 20 by friction force only when they are in contact. Therefore, in this condition, a greater driving force is obtained by increasing the pressure force. However, if the diameter Rt is increased and the diameter Rn is decreased in order to increase the driving speed, the pressure force becomes relatively too large with respect to the diameter Rn, and the elliptical vibrations are made in the condition in which the contact is being made at all times without a break due to the elastic deformation of the rotor 20 or the contacting surface, or due to the elastic deformation of the structural members receiving the pressure force.

In this condition, frictional force acts even when the chip members 103 are moving in the direction opposite to the driving direction during the cycle of vibration, and this becomes a break for the movement along the desired direction of movement. Therefore, in this condition, even if the pressure force is increased, a driving force greater than the force determined by Rn is not obtained. Further, in the drive in such a condition, speed fluctuations and repeatability and other drive conditions become unstable, and also, some abnormalities can occur such as the generation of abnormal sounds. Therefore, the driving force becomes larger since the larger diameter Rn of the elliptical locus along the pressure direction makes a larger pressure force be available, and stable drive becomes possible.

Therefore, the elliptical locus shown in FIG. 9a realizes the low speed and high torque characteristics, and the elliptical locus shown in FIG. 9c realizes the high speed and low torque characteristics, and by changing the phase difference between the driving signals VA and VB, it is possible to control the drive performance, and it becomes possible to carry out a drive such as constant speed control or positioning control with high accuracy, etc.

(DC Drive)

Next, explanations are given about the DC drive. The DC drive is the method of causing minute swinging movement of the rotor 20, is used when extremely high accuracy positioning is demanded, and it is possible to obtain positioning resolution of nanometer order. After carrying out rough movement (high speed, wide rotation angle drive) by resonant drive as explained earlier, by carrying out fine movement using DC drive, it is possible to realize a drive system capable of wide range, high speed drive, and high accuracy positioning.

As the driving method, by applying only a DC voltage to the A-phase electrodes a1, a2, a3, the three driving regions that include the different vertices of the vibrating member 10 bend in the counter clockwise direction as shown in FIG. 8b, and the tips of the chip members 103 fall in the counter clockwise direction. The rotor 20 in frictional contact with the chip members 103 moves (rotates) by the same amount as the movement of the chip members 103 due to frictional force, and return to the original state when the application of the voltage is removed. Similarly, upon applying a DC voltage to only the B-phase electrodes b1, b2, b3, the rotor 20 moves slightly in the opposite direction. Further, when a DC voltage is being applied to the A-phase electrodes a1, a2, a3, by applying a voltage of the opposite polarity to the B-phase electrodes a1, a2, a3, the amount of bending of the vibrating member 10 becomes larger, and a larger amount of rotation of the rotor 20 can be realized.

Preferred Embodiment 2

Figure 10:
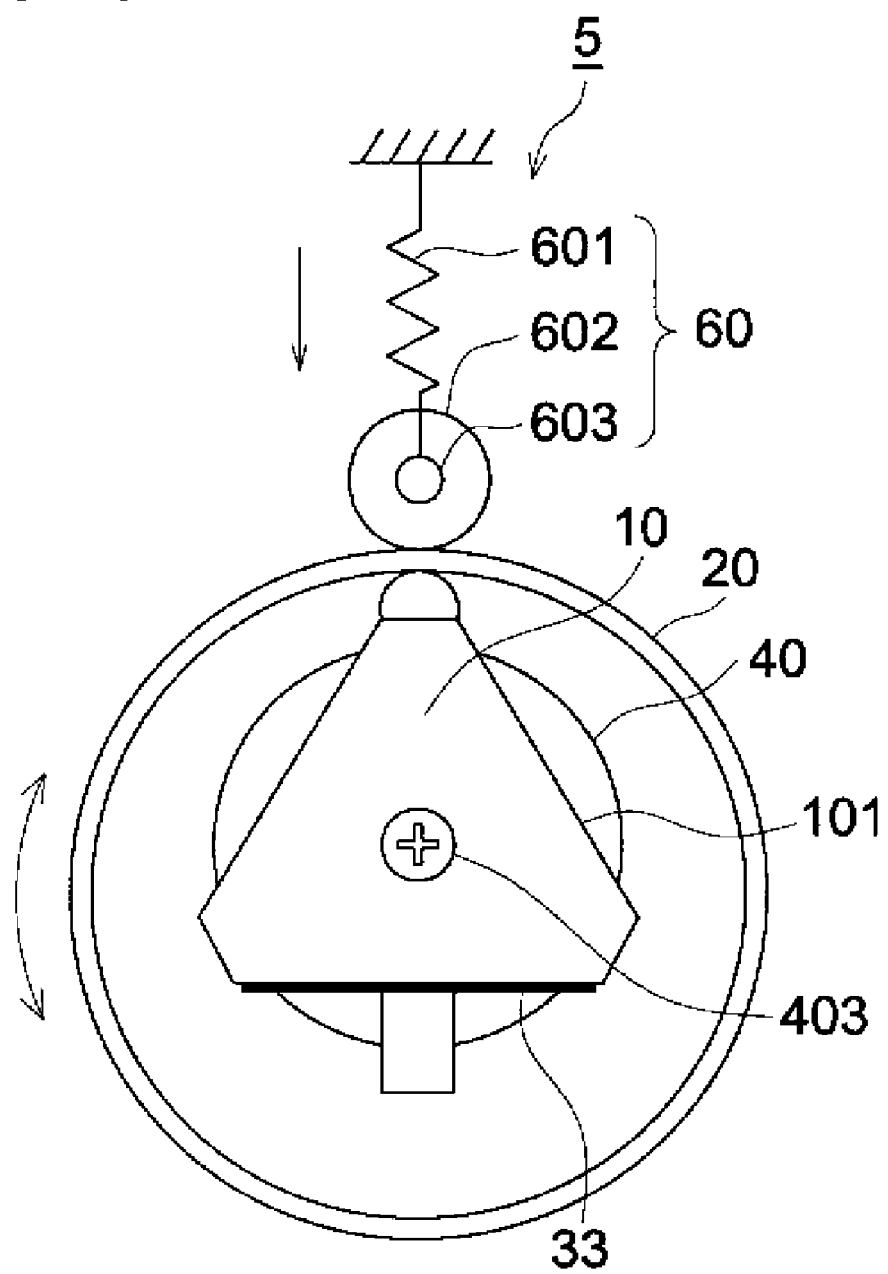
FIG. 10 shows the overall configuration of a ultrasonic actuator according to an embodiment 2 of the present invention.

The ultrasonic actuator 5 according to the preferred embodiment 2 will be described using FIG. 10. FIG. 10 is a front view showing the overall schematic structure of an ultrasonic actuator 5.

As shown in FIG. 10, the ultrasonic actuator comprises a vibrating member 10, a rotor (moving member) 20, a fixing member 40 and pressure-applying portion 60.

In the case of the ultrasonic actuator 5 according to the embodiment 1, the rotor 20 is pressure-contacted with the 3 chip members 103 provided on the vertices of the vibrating member, and the rotor 20 rotates by the elliptical vibrations caused in the 3 chip members, however in the case of the embodiment 2, the rotor 20 is pressure-contacted with the chip member 103 provided on one vertex of the vibrating member 10, and the rotor 20 rotates by the elliptical vibration caused in one of the chip members 103.

As shown in FIG. 10, the rotor 20 is press-contacted to the chip member 103 provided on the vibrating member 10 by a pressure-applying portion 60 that comprises: a coil spring 601, a roller 602, a roller rotating shaft 603 and the like.

When the driving signal is inputted to the vibrating member 10, an elliptical vibration is generated in the chip member provided at one of the vertices of the vibrating member 10. The rotor 20 is in contact with the chip member 103 at a prescribed pressing force, and thus the rotor 20 performs rotation using friction. In FIG. 10, in the case where the chip member 103 performs clockwise elliptical vibration, the rotor 20 also rotates in the clockwise direction, and when the chip member 103 performs anticlockwise elliptical rotation, the rotor 20 also rotates in the anticlockwise direction.

Figures 11A, 11B:
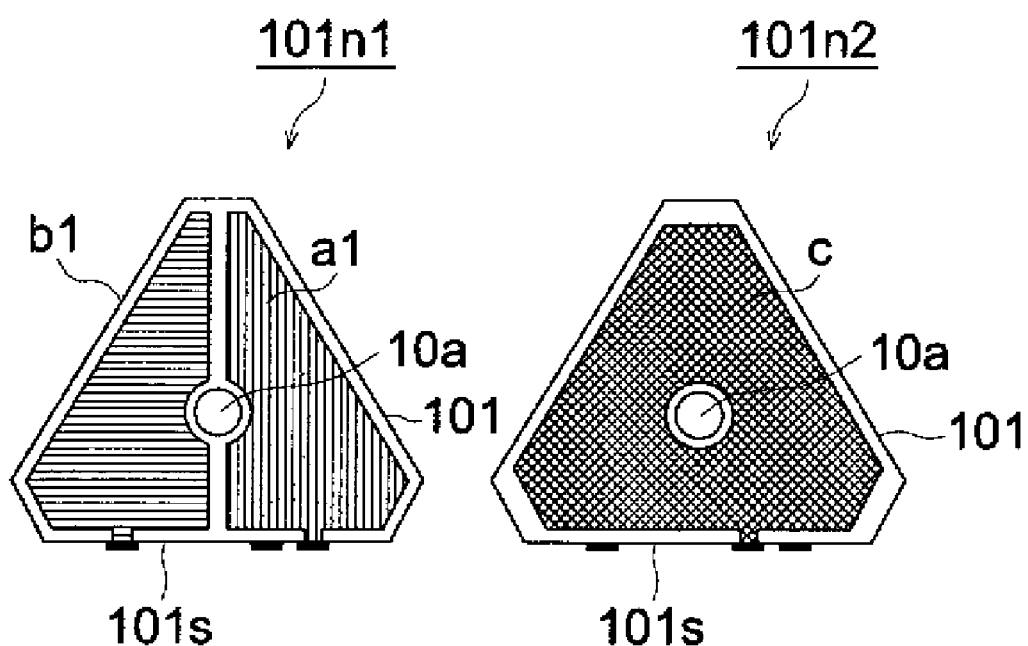
FIGS. 11a, 11b and 11c show the configuration of the internal electrodes of the embodiment 2.
Figure 11C:
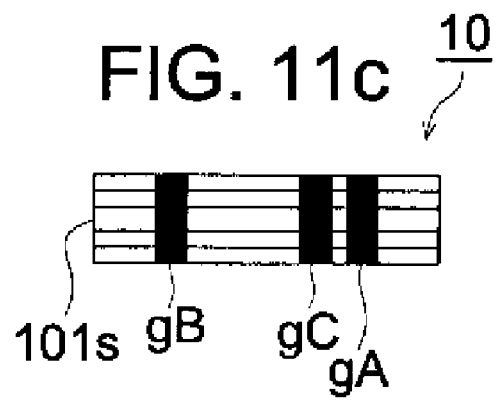

FIGS. 11a and 11b show the internal electrode layer configuration according to the embodiment 2. FIG. 11a shows the configuration of a first electrode layer 101n1; FIG. 11b shows the configuration of a second electrode layer 101n2; and FIG. 11c is a side view of the piezoelectric member 101 which shows the arrangement of external electrodes gA, gB and gC.

As shown in FIG. 11a, the first internal electrode layer 101n has the configuration in which it is divided (into 2 pieces) by a perpendicular line drawn from one of the vertices of the vibrating member 10 to the opposing side in order to excite the elliptical vibration in the one of the vertices of the vibrating member 10. A pair of an A-phase electrode a1 and a B-phase electrode b1 are formed.

In order to interconnect the A-phase electrodes and to interconnect the B-phase electrodes, a portion thereof is projected from the side surface 101s of the piezoelectric member 101 as shown in FIG. 11a.

The second internal electrode layer 101n2 is the common GND electrode. The GND electrode c layers are interconnected each other, and thus, as is the case with the A-phase electrode layers and the B-phase electrode layers, as shown in FIG. 11b, a portion of each of the GND electrode c layers is projected from the side surface 101s of the piezoelectric member 101.

The external electrodes gA, gB and gC are formed, by printing and the like, on the side surface 101s of the piezoelectric member 101 in correspondence to each of the A-phase electrodes, the B-phase electrodes and the projection portion of the GND electrodes as shown in FIG. 11. These external electrodes are connected to the internal electrodes (A-phase electrodes, B-phase electrodes and GND electrodes).

In this type of configuration also, as is the case with the embodiment 1, all of the plurality of external electrodes gA, gB and gC are all disposed on one side surface 101s of the piezoelectric member 101, and thus connection of the external electrodes with the lead wires or the FPC and the like, or the routing of these wire members can be easily processed.

It is to be noted that the method for driving the ultrasonic actuator 5 having this type of configuration may be in accordance with a known driving method disclosed in Unexamined Japanese Patent Application Publication No. H8-322270.

According to the present embodiments, the configuration is such that the plurality of external electrodes to which a prescribed internal electrode layers, in each of which the internal electrodes are provided, are electrically connected, are integrally disposed on one side surface of the substantially triangular vibrating member. That is to say, because all of the plurality of external electrodes are disposed on the end surface of one side of the vibrating member, connection of the external electrodes with the lead wires or the FPC and the like, or routing of these wire members can be easily processed. In addition, in the case where the external electrodes are formed using screen printing for example, it is sufficient for the printing step to be performed only on one surface, and thus production cost is reduced.

In addition, in the step prior to the step of cutting out a plurality of piezoelectric deformation portions from the piezoelectric block in which piezoelectric layers and internal electrode layers are alternately laminated, the external electrodes are formed at the end surface of the piezoelectric block in accordance with the plurality of piezoelectric deformation portions. As a result, external electrodes can be formed at one time on a plurality of piezoelectric deformation portions, and thus productivity is increased.

What is claimed is:

1. An ultrasonic actuator, comprising:
a vibrating member which includes a piezoelectric deformation portion and deforms by a driving signal; the piezoelectric deformation portion including:
a plurality of piezoelectric layers made of a piezoelectric material;
a plurality of internal electrode layers alternately laminated with the piezoelectric layers, each of the internal electrode layers being divided into a plurality of internal electrodes, each of which is applied with the driving signal, wherein a cross section of the vibrating member perpendicular to a direction of the lamination is a substantially triangular shape having three vertices; and
a plurality of external electrodes which are integrally provided on a side surface including one side of the triangular shape, each of the external electrodes electrically interconnecting internal electrodes, which are overlapping one another in the direction of the lamination, in a predetermined combination, and
a moving member which has a hollow cylindrical shape and is pressure-contacted with the vibrating member at the three vertices and moves relatively to the vibrating member by a deformation motion of the vibrating member, and the external electrodes are disposed only on one side surface including any one side of the triangular shape,
wherein each of the divided internal electrodes in each of the internal electrode layers include 6 internal electrodes, each pair of which are disposed in correspondence to each of the three vertices, the piezoelectric deformation portions deforms by the driving signal supplied to the internal electrodes through the external electrodes, the deformation causes elliptical vibrations in the three vertices of the vibrating member in a same direction, and the elliptical vibrations cause the moving member to move relatively to the vibrating member.

2. The ultrasonic actuator of claim 1, wherein each of the external electrodes electrically interconnects every other internal electrode of the internal electrodes overlapping one another in a direction of the lamination.

3. An ultrasonic actuator, comprising:
a vibrating member which includes a piezoelectric deformation portion and deforms by a driving signal; the piezoelectric deformation portion including:
a plurality of piezoelectric layers made of a piezoelectric material;
a plurality of internal electrode layers alternately laminated with the piezoelectric layers, each of the internal electrode layers including six internal regions, each of which is supplied with the driving signal, wherein a cross section of the vibrating member perpendicular to a direction of the lamination is a substantially triangular shape having three vertices; and
a plurality of external electrodes which are integrally provided on a side surface including one side of the triangular shape, each of the external electrodes electrically interconnecting internal electrodes, which are overlapping one another in the direction of the lamination, in a predetermined combination, and
a moving member which has a hollow cylindrical shape and is pressure-contacted with the vibrating member at the three vertices and moves relatively to the vibrating member by a deformation motion of the vibrating member, and the external electrodes are disposed only on one side surface including any one side of the triangular shape, wherein every two of the internal regions form a region pair which is disposed in correspondence to each of the three vertices, the piezoelectric deformation portions deforms by the driving signal supplied to the internal regions through the external electrodes, the deformation causes elliptical vibrations in the three vertices of the vibrating member in a same direction, and the elliptical vibrations cause the moving member to move relatively to the vibrating member.

4. An ultrasonic actuator, comprising:

a vibrating member which includes a piezoelectric deformation portion and deforms by a driving signal; the piezoelectric deformation portion including:

a plurality of piezoelectric layers made of a piezoelectric material, each of which has a hole therein for fixing the vibrating member;

a plurality of internal electrode layers alternately laminated with the piezoelectric layers, wherein a cross section of the vibrating member perpendicular to a direction of the lamination is a substantially triangular shape having three vertices, each of the internal electrode layers is divided into two internal electrodes such that the two internal electrodes sandwich the hole, and each of the divided internal electrodes is applied with the driving signal, and a plurality of external electrodes which are integrally provided on a side surface including one side of the triangular shape, each of the external electrodes electrically interconnecting internal electrodes, which are overlapping one another in the direction of the lamination, in a predetermined combination, and a moving member which is pressure-contacted with the vibrating member at one of the vertices and moves relatively to the vibrating member by a deformation motion of the vibrating member.

* * * * *